(12) United States Patent
Maeng et al.

(10) Patent No.: US 11,469,310 B2
(45) Date of Patent: Oct. 11, 2022

(54) SEMICONDUCTOR DEVICE

(71) Applicant: SK hynix Inc., Gyeonggi-do (KR)

(72) Inventors: Wan Joo Maeng, Gyeonggi-do (KR); Hyun Soo Jin, Gyeonggi-do (KR); Se Hun Kang, Gyeonggi-do (KR); Ki Vin Im, Gyeonggi-do (KR); Kyoung Ryul Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/095,859

(22) Filed: Nov. 12, 2020

(65) Prior Publication Data

US 2021/0359100 A1  Nov. 18, 2021

(30) Foreign Application Priority Data

May 18, 2020 (KR) .................. 10-2020-0059084

(51) Int. Cl.
*H01L 29/51* (2006.01)
*H01L 27/11502* (2017.01)
*H01L 27/11585* (2017.01)
*H01L 21/28* (2006.01)
*H01L 49/02* (2006.01)

(52) U.S. Cl.
CPC ...... *H01L 29/516* (2013.01); *H01L 27/11502* (2013.01); *H01L 27/11585* (2013.01); *H01L 28/56* (2013.01); *H01L 29/40111* (2019.08)

(58) Field of Classification Search
None
See application file for complete search history.

(56) References Cited

U.S. PATENT DOCUMENTS

| | | | |
|---|---|---|---|
| 6,437,380 B1* | 8/2002 | Lim | H01L 29/516 257/295 |
| 10,056,393 B2* | 8/2018 | Schroder | H01L 29/78391 |
| 10,153,155 B2* | 12/2018 | Nishida | H01L 21/02356 |
| 2017/0103988 A1* | 4/2017 | Nishida | H01L 29/517 |
| 2017/0256552 A1* | 9/2017 | Schroder | H01L 29/78391 |
| 2018/0233573 A1 | 8/2018 | Lin et al. | |
| 2019/0148390 A1* | 5/2019 | Frank | H01L 21/02181 257/295 |
| 2020/0194443 A1* | 6/2020 | Lin | H01L 28/65 |
| 2021/0091227 A1* | 3/2021 | Heo | H01L 29/6684 |
| 2021/0242225 A1* | 8/2021 | Manfrini | H01L 29/40111 |
| 2021/0359101 A1* | 11/2021 | Heo | H01L 29/7851 |

\* cited by examiner

*Primary Examiner* — Steven M Christopher
(74) *Attorney, Agent, or Firm* — IP & T Group LLP

(57) ABSTRACT

A semiconductor device includes: a first electrode; a second electrode; and a dielectric layer stack positioned between the first electrode and the second electrode, the dielectric layer stack including a first anti-ferroelectric layer, a second anti-ferroelectric layer, and a ferroelectric layer between the first anti-ferroelectric layer and the second anti-ferroelectric.

18 Claims, 15 Drawing Sheets

SEMICONDUCTOR DEVICE

CROSS-REFERENCE TO RELATED APPLICATIONS

The present application claims priority to Korean Patent Application No. 10-2020-0059084, filed on May 18, 2020, which is incorporated herein by reference in its entirety.

BACKGROUND

1. Field

Various embodiments of the present invention relate generally to a semiconductor device and, more particularly, to an improved semiconductor device including both an anti-ferroelectric material and a ferroelectric material.

2. Description of the Related Art

Sufficient capacitance has to be maintained to ensure sufficient operation characteristics while further scaling down the size of a capacitor in a semiconductor device. One way to achieve this includes increasing the dielectric constant of the dielectric material employed in the capacitor. However, known materials which are compatible with semiconductor processing are limited, and therefore there are currently limits in scaling down the size of capacitors in a semiconductor device while maintaining an effective capacitance.

SUMMARY

Embodiments of the present invention are directed to a semiconductor device including a dielectric layer stack having a high dielectric constant. The semiconductor device may include a capacitor.

In accordance with an embodiment of the present invention, a semiconductor device includes: a first electrode; a second electrode; and a dielectric layer stack positioned between the first electrode and the second electrode, the dielectric layer stack including a first anti-ferroelectric layer, a second anti-ferroelectric layer, and a ferroelectric layer disposed between the first anti-ferroelectric layer and the second anti-ferroelectric.

In accordance with another embodiment of the present invention, a semiconductor device includes: a first electrode; a second electrode; and an alternating stack that is positioned between the first electrode and the second electrode, the alternating stack including a plurality of dielectric layer stacks and a plurality of leakage blocking layers that are alternately stacked, wherein each of the dielectric layer stacks includes a first anti-ferroelectric layer, a second anti-ferroelectric layer, and a ferroelectric layer disposed between the first anti-ferroelectric layer and the second anti-ferroelectric layer.

These and other features and advantages of the present invention will become understood by those having ordinary skill in the art of the invention from the following figures and detailed description.

DETAILED DESCRIPTION

Figure 1:
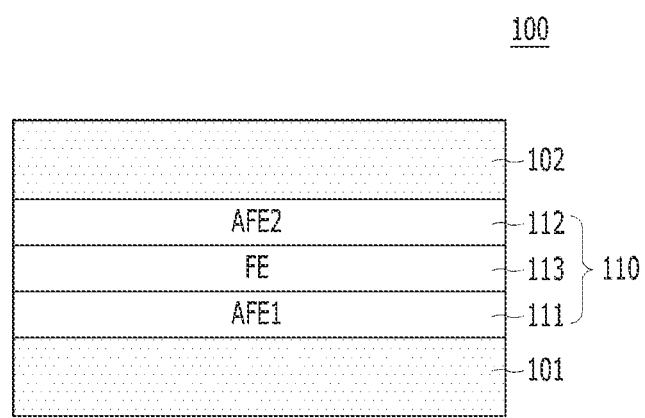
FIG. 1 illustrates a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

It will be further understood that when an element is referred to as being "connected to", or "coupled to" another element, it may be directly on, connected to, or coupled to the other element, or one or more intervening elements may be present. Furthermore, the connection/coupling may not be limited to a physical connection but may also include a non-physical connection, e.g., a wireless connection.

In addition, it will also be understood that when an element is referred to as being "between" two elements, it may be the only element between the two elements, or one or more intervening elements may also be present.

When a first element is referred to as being "over" a second element, it not only refers to a case where the first element is formed directly on the second element but also a case where a third element exists between the first element and the second element.

It should be understood that the drawings are simplified schematic illustrations of the described devices and may not include well known details for avoiding obscuring the features of the invention.

It should also be noted that features present in one embodiment may be used with one or more features of another embodiment without departing from the scope of the invention.

It is further noted, that in the various drawings, like reference numbers designate like elements.

The composition of hafnium oxide ($HfO_2$) and zirconium oxide ($ZrO_2$) may be adjusted to have ferroelectric characteristics or anti-ferroelectric characteristics. Accordingly, it is required to control polarization switching to occur at around the operation voltage of a volatile memory such as a Dynamic, Random-Access Memory (DRAM) and to use the dielectric constant that is maximized in that area.

When a ferroelectric material is used, the coercive field, which is an operation voltage, may be low, but even when the operation voltage is removed (e.g., operation voltage is 0 V), the polarization does not become 0 and remnant polarization remains. This may restrict the use of the ferroelectric material for a DRAM.

When an anti-ferroelectric material is used, it is required to lower the coercive field in order to use the DRAM because the coercive field in which polarization switching occurs is relatively large.

The dielectric material of a capacitor of a DRAM, according to an embodiment of the present invention provides a combination of the low coercive field (which is a characteristic of a ferroelectric material), no remnant polarization (which is a characteristic of an anti-ferroelectric material), and a high dielectric constant during a polarization switching operation (which is a common characteristics of both the ferroelectric material and the anti-ferroelectric material).

The dielectric constant of the ferroelectric material is largest in the vicinity of the coercive field. Some researchers are developing memory devices using ferroelectric materials having a relatively low coercive field. However, such devices may have problems because the polarization does not become 0 at 0V and the remnant polarization remains. Thus, there is a limit in using a ferroelectric material in a volatile memory. On the other hand, the anti-ferroelectric material has a polarization of 0 at 0V, but has a relatively high coercive field, which limits its application to a volatile memory.

In the following embodiments of the present invention, a semiconductor device including a stack structure is provided which employs both a ferroelectric material and an anti-ferroelectric material. The stack structure achieves a low switching voltage, that is, a low coercive field, high capacitance, and no remnant polarization.

FIG. 1 illustrates a semiconductor device 100 in accordance with an embodiment of the present invention.

Referring to FIG. 1, the semiconductor device 100 may be a portion of a memory. The semiconductor device 100 may be a portion of a volatile memory. The semiconductor device 100 may be a portion of DRAM. The semiconductor device 100 may include a DRAM capacitor.

The semiconductor device 100 may include a first electrode 101, a second electrode 102, and a dielectric layer stack 110 positioned between the first electrode 101 and the second electrode 102. The dielectric layer stack 110 may directly contact the first and the second electrodes 101, 102.

The first electrode 101 may include a metal-containing material. The first electrode 101 may include, for example, a metal a metal nitride, a metal carbide, a conductive metal nitride, a conductive metal oxide, or combinations thereof. The first electrode 101 may include, for example, titanium (Ti), titanium nitride (TiN), tantalum nitride (TaN), tungsten (W), tungsten nitride (WN), ruthenium (Ru), iridium (Ir), ruthenium oxide (RuO$_2$), iridium oxide (IrO$_2$), niobium nitride (NbN), molybdenum nitride (MoN), or a combination thereof. According to another embodiment of the present invention, the first electrode 101 may include a silicon-containing material. The first electrode 101 may include, for example, silicon, silicon germanium, or a combination thereof. According to another embodiment of the present invention, the first electrode 101 may include a stack of a metal-containing material and a silicon-containing material. The first electrode 101 may also be referred to as 'a bottom electrode' or a storage node.

The second electrode 102 may include a silicon-containing material, a germanium-containing material, a metal-containing material, or a combination thereof. The second electrode 102 may include, for example, a metal, a metal nitride, a metal carbide, a conductive metal nitride, a conductive metal oxide, or a combination thereof. The second electrode 102 may include, for example, titanium (Ti), titanium nitride (TiN), tantalum nitride (TaN), titanium carbon nitride (TiCN), tantalum carbon nitride (TaCN), tungsten (W), tungsten nitride (WN), ruthenium (Ru), iridium (Ir), ruthenium oxide (RuO$_2$), niobium nitride (NbN), molybdenum nitride (MoN), iridium oxide (IrO$_2$), silicon (Si), germanium (Ge), silicon germanium (SiGe), or a combination thereof. The second electrode 102 may include 'a Si/SiGe stack' in which silicon germanium is stacked over silicon. In an embodiment, the second electrode 102 may include 'a Ge/SiGe stack' in which silicon germanium is stacked over germanium. In another embodiment, the second electrode 102 may be formed by stacking silicon germanium over a metal nitride. For example, the second electrode 102 may be formed by stacking silicon germanium (SiGe) over titanium nitride (TiN). According to another embodiment of the present invention, the second electrode 102 may include titanium nitride (TiN), silicon germanium (SiGe), and tungsten (W) that are stacked in the mentioned order. According to another embodiment of the present invention, the second electrode 102 may include titanium nitride (TiN), silicon germanium (SiGe), and tungsten nitride (WN) that are stacked in the mentioned order.

The dielectric layer stack 110 may include at least one high-k material having a high dielectric constant of approximately 7 or higher. The high-k material may have a higher dielectric constant than silicon oxide and silicon nitride. The dielectric layer stack 110 may include at least one ultra high-k material. The ultra high-k material may be a material having a higher dielectric constant than the high-k material. The ultra high-k material may have a high dielectric constant of approximately 60 or higher. The dielectric layer stack 110 may include at least one ferroelectric material and at least one anti-ferroelectric material.

The dielectric layer stack 110 may include a multi-layered stack of different dielectric materials. The dielectric layer stack 110 may include a triple stack including a first dielectric layer 111, a second dielectric layer 112, and a third dielectric layer 113. The third dielectric layer 113 may be positioned between the first dielectric layer 111 and the second dielectric layer 112. The first dielectric layer 111, the second dielectric layer 112, and the third dielectric layer 113 may be vertically arranged between the first electrode 101 and the second electrode 102.

At least one among the first dielectric layer 111, the second dielectric layer 112, and the third dielectric layer 113 may be a ferroelectric material FE. For example, the third dielectric layer 113 may be a ferroelectric material FE. The first dielectric layer 111 and the second dielectric layer 112 may be materials that are different from the third dielectric layer 113. The first dielectric layer 111 and the second dielectric layer 112 may be the same material or different materials. At least one of the first dielectric layer 111 and the second dielectric layer 112 may be anti-ferroelectric materials AFE. In the embodiment, of FIG. 1, both the first dielectric layer 111 and the second dielectric layer 112 may be anti-ferroelectric materials AFE1, AFE2.

The first dielectric layer 111 may include a first anti-ferroelectric material AFE1, and the second dielectric layer 112 may include, for example, a second anti-ferroelectric material AFE2. The first anti-ferroelectric material AFE1 and the second anti-ferroelectric material AFE2 may be the same anti-ferroelectric material. Alternatively, the first anti-ferroelectric material AFE1 and the second anti-ferroelectric material AFE2 may be different anti-ferroelectric materials. For example, the first anti-ferroelectric material AFE1 and the second anti-ferroelectric material AFE2 may include, for example, (Hf) and zirconium (Zr). The first anti-ferroelectric material AFE1 and the second anti-ferroelectric material AFE2 may be made of an oxide including hafnium (Hf) and zirconium (Zr). The first anti-ferroelectric material AFE1 and the second anti-ferroelectric material AFE2 may be made of a first hafnium zirconium oxide (HfZrO).

Other suitable materials for the first and second anti-ferroelectric materials AFE1 and AFE2 may include $PbZrO_3$, $PbHfO_3$, $PbMgWO_3$, $PbZrTiO_3$, $BiNaTiO_3$, $NaNbO_3$ or a combination thereof.

The third dielectric layer 113 may include a ferroelectric material FE. The ferroelectric material FE may include, for example, (Hf) and zirconium (Zr). The ferroelectric material FE may be made of an oxide including hafnium (Hf) and zirconium (Zr). The ferroelectric material FE may include, for example, a second hafnium zirconium oxide (HfZrO).

Other suitable materials for the ferroelectric material FE may include $BaTiO_3$, $PbTiO_3$, $BiFeO_3$, $SrTiO_3$, $PbMgNdO_3$, $PbMgNbTiO_3$, $PbZrNbTiO_3$, $PbZrTiO_3$, $KNbO_3$, $LiNbO_3$, GeTe, $LiTaO_3$, $KNaNbO_3$, $BaSrTiO_3$ and combinations thereof.

The first anti-ferroelectric material AFE1 and the second anti-ferroelectric material AFE2 may include a first hafnium zirconium oxide, and the third dielectric layer 113 may include, for example, a second hafnium zirconium oxide. The first hafnium zirconium oxide and the second hafnium zirconium oxide may have different hafnium composition ratios. The first hafnium zirconium oxide and the second hafnium zirconium oxide may have different zirconium composition ratios. The first hafnium zirconium oxide and the second hafnium zirconium oxide may have different hafnium composition ratios and zirconium composition ratios.

The dielectric layer stack 110 of the semiconductor device 100 of FIG. 1 may include a multi-layered stacked structure including a ferroelectric material and an anti-ferroelectric material. A low coercive field may be obtained by the ferroelectric material FE, and no-remnant polarization (i.e. zero level of remaining polarization) may be maintained by the first and second anti-ferroelectric materials AFE1 and AFE2.

In the embodiment of FIG. 1, forming the first and second anti-ferroelectric materials AFE1 and AFE2 in direct contact with the first electrode 101 and the second electrode 102, respectively, allows, obtaining a polarization of '0' when no voltage (0V) is applied between the first electrode 101 and the second electrode 102. When the voltage applied between the first electrode 101 and the second electrode 102 is gradually increased, a high dielectric constant may be secured as the ferroelectric material FE begins switching first. Then, when the applied voltage is turned off (i.e., 0 V), the polarization becomes '0' again (i.e., no remnant polarization), thus implementing an operation to a volatile memory.

The dielectric layer stack 110 may be referred to as 'an AFE-FE-AFE stack' because one ferroelectric material FE is positioned between two anti-ferroelectric materials AFE1 and AFE2. The dielectric layer stack 110 may have polarity-voltage characteristics with hysteresis loops showing two polarization characteristics (AFE-like and FE-like). The hysteresis loop of the dielectric layer stack 110 may have a non-linear direct contact point. Herein, the polarization of the non-linear direct contact point may be '0'.

Figure 2A:
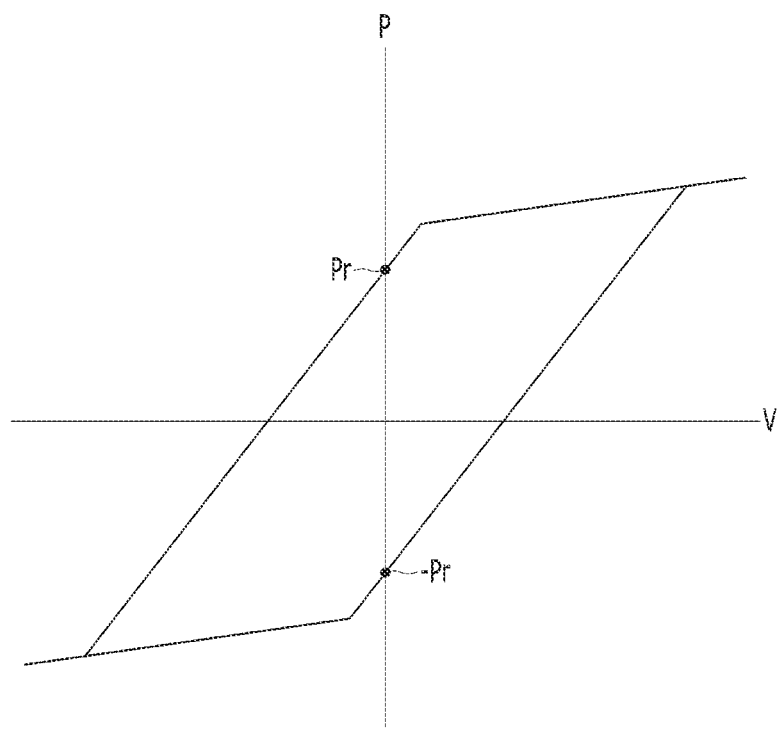
FIGS. 2A and 2B illustrate the polarization characteristics of a ferroelectric and an anti-ferroelectric material respectively.
Figure 2B:
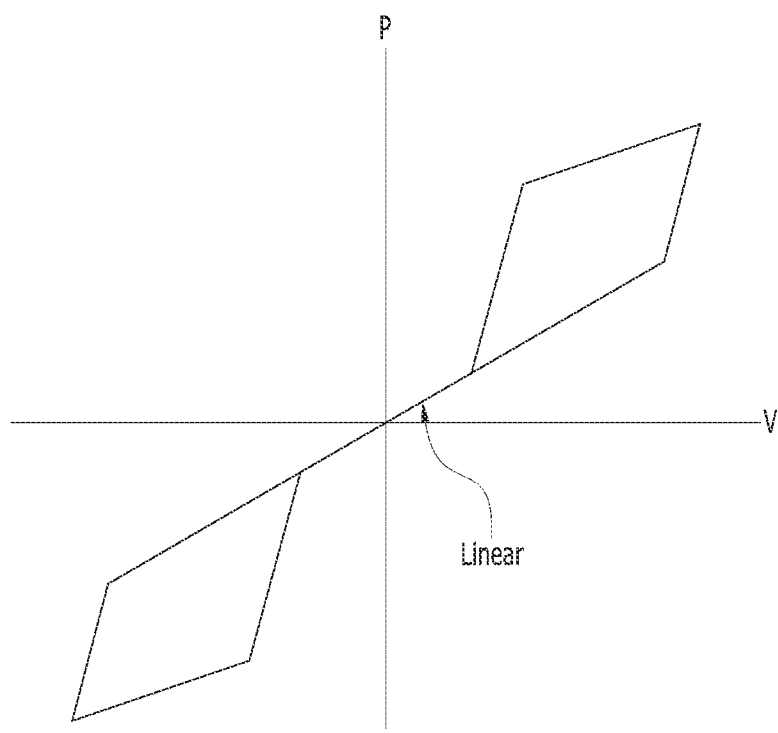
Figure 2C:
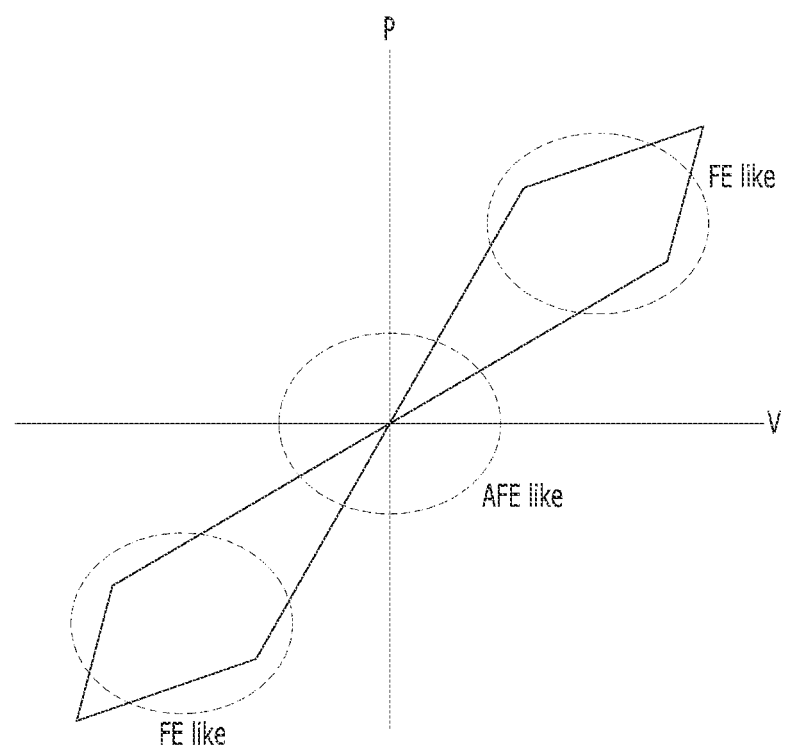
FIG. 2C illustrate the polarization characteristics of a stack including both a ferroelectric and an anti-ferroelectric material.

FIG. 2A describes the polarity-voltage characteristics of a ferroelectric material. FIG. 2B illustrates the polarity-voltage characteristics of an anti-ferroelectric material. FIG. 2C illustrates the polarity-voltage characteristics of an AFE-FE-AFE stack.

Referring to FIG. 2A, the ferroelectric material FE may have a high capacitance at a low voltage, but remnant polarization (Pr and −Pr) may be present.

Referring to FIG. 2B, the anti-ferroelectric material AFE may have no remnant polarization (Pr), but it may have a low capacitance at a low voltage.

Referring to FIG. 2C, the AFE-FE-AFE stack may have polarity-voltage characteristics that exhibit two polarization characteristics (AFE-like and FE-like). The hysteresis loop of the AFE-FE-AFE stack may have a ferroelectric polarization (FE-like), an anti-ferroelectric polarization (AFE-like), and a non-linear direct contact point. Herein, when the applied voltage is 0V, the non-linear direct contact point may have a polarization of '0'. In the anti-ferroelectric hysteresis loop of FIG. 2B, a section in which polarization is '0' may be linear.

Referring to FIG. 2C, it can be seen that the AFE-FE-AFE stack has a high capacitance at a low voltage and has the hysteresis loop with no remnant polarization.

Figure 3:
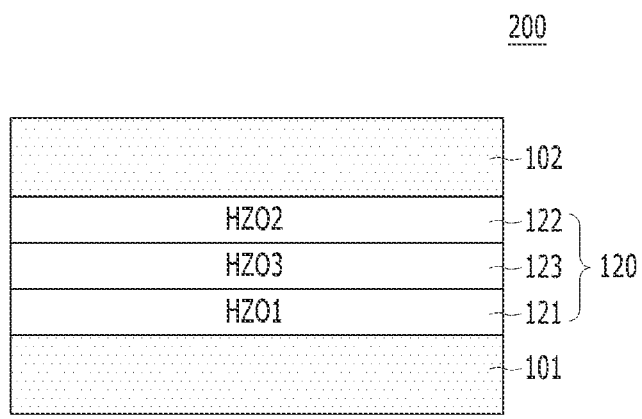
FIGS. 3 to 8B illustrate a semiconductor device in accordance with other embodiments of the present invention.

FIG. 3 illustrates a semiconductor device in accordance with another embodiment of the present invention.

The constituent elements of the semiconductor device 200 shown in FIG. 2, except for the dielectric layer stack 120, may be the same as the constituent elements of the semiconductor device 100 shown in FIG. 1. Hereinafter, as for the descriptions of the first electrode and the second electrode, FIG. 1 will be referred to. The semiconductor device 200 may be a portion of a memory. The semiconductor device 200 may be a portion of a volatile memory. The semiconductor device 200 may be a portion of a DRAM. The semiconductor device 200 may include a DRAM capacitor.

Referring to FIG. 3, the semiconductor device 200 may include a first electrode 101, a second electrode 102, and a dielectric layer stack 120 between the first electrode 101 and the second electrode 102.

The dielectric layer stack 120 may include different hafnium zirconium oxides that are stacked on one another. Here, the different hafnium zirconium oxides may have different hafnium composition ratios, different zirconium composition ratios, or different hafnium composition ratios and zirconium composition ratios. The different hafnium zirconium oxides may have different thicknesses. The different hafnium zirconium oxides may have different polarization characteristics. The hafnium zirconium oxide may include $Hf_xZr_yO$ (x>0, y>0, and x+y=1).

Hafnium zirconium oxide ($Hf_xZr_yO$) may have a ferroelectric characteristic or an anti-ferroelectric characteristic according to the ratio of the hafnium content (x) and the zirconium content (y). The ferroelectric hafnium zirconium oxide may have a hafnium content (x) of from approximately 0.46 to approximately 0.75, and a zirconium content (y) of from approximately 0.25 to approximately 0.54. The anti-ferroelectric hafnium zirconium oxide may have a hafnium content (x) of from approximately 0.2 to approximately 0.45 and a zirconium content (y) of from approximately 0.55 to approximately 0.8.

The dielectric layer stack 120 may include a first hafnium zirconium oxide (HZO1) 121, a second hafnium zirconium oxide (HZO2) 122, and a third hafnium zirconium oxide (HZO3) 123 between the first hafnium zirconium oxide 121 and the second hafnium zirconium oxide 122. Reference numerals HZO1, HZO2, and HZO3 may refer to $Hf_xZr_yO$, individually.

The first hafnium zirconium oxide 121 and the third hafnium zirconium oxide 123 may have different hafnium composition ratios. The first hafnium zirconium oxide 121 and the third hafnium zirconium oxide 123 may have different zirconium composition ratios. The first hafnium zirconium oxide 121 and the third hafnium zirconium oxide 123 may have different hafnium composition ratios and different zirconium composition ratios. The first hafnium zirconium oxide 121 and the second hafnium zirconium oxide 122 may have the same hafnium composition ratio and the same zirconium composition ratio.

The first hafnium zirconium oxide 121 may include $Hf_xZr_yO$ (x>0, y>0, x=0.46~0.75, y=0.25~0.54, x+y=1). In $Hf_xZr_yO$, the hafnium content (x) and the zirconium content (y) may be the same. In one example, the hafnium content (x) may be 0.5, and the zirconium content (y) may be 0.5.

The second hafnium zirconium oxide 122 may include $Hf_xZr_yO$ (x>0, y>0, x=0.46~0.75, y=0.25~0.54, x+y=1). In the second hafnium zirconium oxide 122 the hafnium content (x) and the zirconium content (y) may be the same. For example, the ratio of the hafnium content (x) and the zirconium content (y) may be approximately 1:1. For example, the hafnium content (x) may be approximately 0.5, and the zirconium content (y) may be approximately 0.5.

The third hafnium zirconium oxide 123 may include $Hf_xZr_yO$ (x>0, y>0, x=0.2~0.45, y=0.55~0.8, x+y=1, and y>x). In $Hf_xZr_yO$, the hafnium content (x) may be smaller than the zirconium content (y). For example, the zirconium content (y) may be at least twice as much as the hafnium content (x). For example, the ratio of the zirconium content (y) and the hafnium content (x) may be approximately 2:1. As an example, the hafnium content (x) may be approximately 0.3, and the zirconium content (y) may be approximately 0.7. As such, a hafnium zirconium oxide having a high zirconium content (y) may be referred to as a 'zirconium (Zr)-rich hafnium zirconium oxide' or a 'zirconium oxide-rich hafnium zirconium oxide'. The third hafnium zirconium oxide 123 may have a greater zirconium content than the first and second hafnium zirconium oxides 121 and 122.

The hafnium zirconium oxide ($Hf_xZr_yO$) may have a ferroelectric FE characteristic or an anti-ferroelectric characteristic AFE based on the hafnium content (x) and the zirconium content (y). Also, a critical thickness at which a change between the ferroelectric FE characteristic and the anti-ferroelectric characteristic AFE appears may differ based on the hafnium content (x) and the zirconium content (y).

When the hafnium content (x) and the zirconium content (y) are the same, for example, $Hf_{0.5}Zr_{0.5}O$ may have a ferroelectric characteristic.

When the zirconium content is greater than the hafnium content (i.e., a zirconium-rich $Hf_xZr_yO$), for example, $Hf_{0.3}Zr_{0.7}O$, it may have an anti-ferroelectric AFE characteristic.

Referring to FIG. 3, the third hafnium zirconium oxide 123 having a ferroelectric characteristic may be controlled to have a hafnium content and a zirconium content in a ratio of 1:1, and the first and second hafnium zirconium oxides having an anti-ferroelectric characteristic 121 and 122 may be controlled to have the zirconium content and the hafnium content in a ratio of at least 2 times or more zirconium than hafnium (e.g., y/x at least equal to 2:1).

As the dielectric layer 123 is formed by controlling the composition of the zirconium content and the hafnium content in this way, a polarization-voltage curve may begin switching at a low voltage and the polarization becomes '0' again at '0 V', thereby implementing an operation as a volatile memory.

In the embodiment of FIG. 1, the first and second dielectric layers 111, 112, are in direct contact with the first and second electrodes 101 and 102, respectively. Also, in the embodiment of FIG. 3, the first and second hafnium zirconium oxides 121, 122 are in direct contact with the first and second electrodes 101 and 102, respectively.

Figure 4:
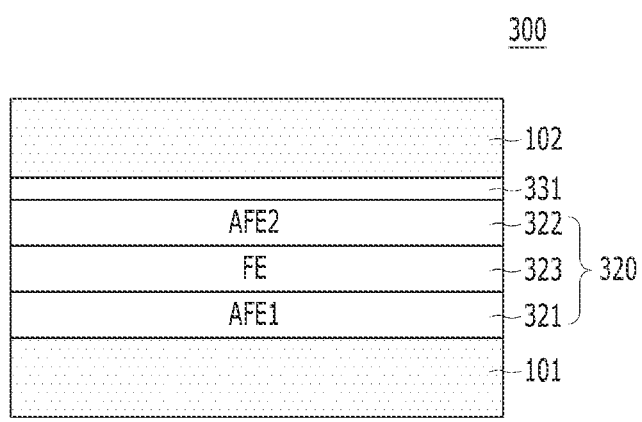

FIG. 4 is a diagram for describing a semiconductor device in accordance with another embodiment of the present invention. The semiconductor device 300 of FIG. 4 may have the same constituent elements as the semiconductor device 100 of FIG. 1, except for an interface layer 331. Hereinafter, as for the detailed descriptions on the first electrode and the second electrode, FIG. 1 and the description thereof may be referred to. The semiconductor device 300 may be a portion of a memory. The semiconductor device 300 may be a portion of a volatile memory. The semiconductor device 300 may be a portion of a DRAM. The semiconductor device 300 may include a DRAM capacitor.

Referring to FIG. 4, the semiconductor device 300 may include the first electrode 101, the second electrode 102, and a dielectric layer stack 320 disposed between the first electrode 101 and the second electrode 102. The semiconductor device 300 may further include an interface layer 331 disposed between the second electrode 102 and the dielectric layer stack 320.

The dielectric layer stack 320 may include a multi-layer stack of different dielectric materials. The dielectric layer stack 320 may have a triple stack including a first anti-ferroelectric layer 321, a second anti-ferroelectric layer 322, and a ferroelectric layer 323. The ferroelectric layer 323 may be positioned between the first anti-ferroelectric layer 321 and the second anti-ferroelectric layer 322.

The first anti-ferroelectric layer 321 and the second anti-ferroelectric layer 322 may be made of the same anti-ferroelectric material or different anti-ferroelectric materials. The first anti-ferroelectric layer 321 and the second anti-ferroelectric layer 322 may include, for example, (Hf) hafnium and zirconium (Zr). The first anti-ferroelectric layer 321 and the second anti-ferroelectric layer 322 may be made of an oxide including hafnium (Hf) and zirconium (Zr). The first anti-ferroelectric layer 321 and the second anti-ferroelectric layer 322 may include zirconium-rich hafnium zirconium oxide (Zr-rich HfZrO). The first anti-ferroelectric layer 321 and the second anti-ferroelectric layer 322 may include zirconium-rich hafnium zirconium oxide (Zr-rich HfZrO) having a zirconium content and a hafnium content in a ratio of 2:1. Other suitable materials for the first and second anti-ferroelectric layers 321 and 322 may include $PbZrO_3$, $PbHfO_3$, $PbMgWO_3$, $PbZrTiO_3$, $BiNaTiO_3$, $NaNbO_3$ and combinations thereof.

The ferroelectric layer 323 may include, for example, (Hf) hafnium and zirconium (Zr). The ferroelectric layer 323 may be made of an oxide including hafnium (Hf) and zirconium (Zr). The ferroelectric layer 323 may include a hafnium zirconium oxide (HfZrO) having a zirconium content and a hafnium content in a ratio of 1:1. Other suitable materials for the ferroelectric layer 323 may include $BaTiO_3$, $PbTiO_3$, $BiFeO_3$, $SrTiO_3$, $PbMgNdO_3$, $PbMgNbTiO_3$, $PbZrNbTiO_3$, $PbZrTiO_3$, $KNbO_3$, $LiNbO_3$, GeTe, $LiTaO_3$, $KNaNbO_3$, $BaSrTiO_3$, combinations thereof.

The interface layer 331 may serve to suppress leakage current of the dielectric layer stack 320. The interface layer 331 may serve to protect the dielectric layer stack 320 when the second electrode 102 is formed. The interface layer 331 may include a material that is reduced prior to the dielectric layer stack 320 when the second electrode 102 is formed. The interface layer 331 may serve as a leakage current barrier having a large effective work function (eWF) and a large conduction band offset (CBO). Also, the interface layer 331 may not increase the equivalent oxide film thickness $T_{ox}$ of the dielectric layer stack 320. The interface layer 331 may serve as a portion of the second electrode 102.

The interface layer 331 may be a material having a large electronegativity. The interface layer 331 may have a larger Pauling electronegativity than the dielectric layer stack 320. The interface layer 331 may include a material having a greater Pauling electronegativity (which is, hereinafter, simply referred to as 'an electronegativity') than the first and second anti-ferroelectric layers 321 and 322, and the ferroelectric layer 323. The interface layer 301, may have a sufficiently large electronegativity so that it may be hardly oxidized and readily reduced. Thus, the interface layer 331 may lose oxygen in place of the dielectric layer stack 320, and thus the interface layer 331 may prevent oxygen loss of the dielectric layer stack 320.

The interface layer 331 may include atoms having a large electronegativity, for example, metal atoms, silicon atoms, or germanium atoms. The interface layer 331 may include, for example, titanium (Ti), tantalum (Ta), aluminum (Al), tin (Sn), molybdenum (Mo), ruthenium (Ru), iridium (Ir), niobium (Nb), germanium (Ge), silicon (Si), nickel (Ni), or a combination thereof.

The interface layer 331 may include, for example, titanium oxide, tantalum oxide, niobium oxide, aluminum oxide, silicon oxide ($SiO_2$), tin oxide, germanium oxide, molybdenum dioxide, molybdenum trioxide, iridium oxide, ruthenium oxide, nickel oxide, or a combination thereof. According to another embodiment of the present invention, the interface layer 331 may include a stack of molybdenum and molybdenum nitride (Mo/MoN) or a stack of tungsten and tungsten nitride (W/WN).

Figure 5:
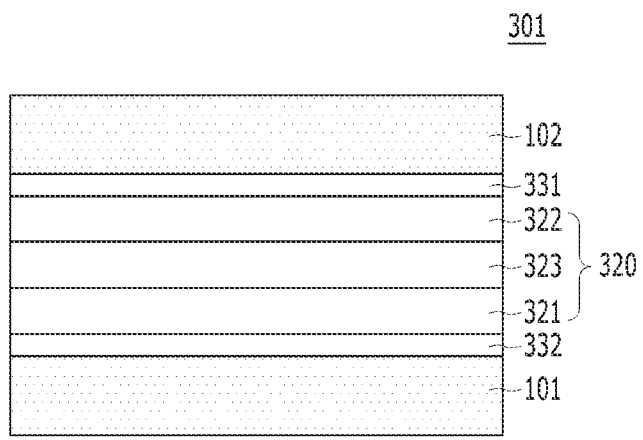

FIG. 5 is a diagram describing a semiconductor device 301 in accordance with another embodiment of the present invention. The constituent elements of the semiconductor device 301 of FIG. 5 except for an additional interface layer 332 may be the same as those of the semiconductor device 300 shown in FIG. 4. The semiconductor device 301 may be a portion of a memory. The semiconductor device 301 may be a portion of a volatile memory. The semiconductor device 301 may be a portion of a DRAM. The semiconductor device 301 may include a DRAM capacitor.

Referring to FIG. 5, the semiconductor device 301 may include the first electrode 101, the second electrode 102, the dielectric layer stack 320 disposed between the first electrode 101 and the second electrode 102, and the interface layer 331 between the second electrode 102 and the dielectric layer stack 320. The semiconductor device 301 may further include an additional interface layer 332 disposed between the first electrode 101 and the dielectric layer stack 320.

The dielectric layer stack 320 may include a multi-layer stack of different dielectric materials. The dielectric layer stack 320 may include a triple stack including the first anti-ferroelectric layer 321, the second anti-ferroelectric layer 322, and the ferroelectric layer 323. The ferroelectric layer 323 may be positioned between the first anti-ferroelectric layer 321 and the second anti-ferroelectric layer 322.

The first anti-ferroelectric layer 321 and the second anti-ferroelectric layer 322 may be the same anti-ferroelectric material or different anti-ferroelectric materials. The first anti-ferroelectric layer 321 and the second anti-ferroelectric layer 322 may include, for example, (Hf) hafnium and zirconium (Zr). The first anti-ferroelectric layer 321 and the second anti-ferroelectric layer 322 may be oxides including hafnium (Hf) and zirconium (Zr). The first anti-ferroelectric layer 321 and the second anti-ferroelectric layer 322 may include a zirconium-rich hafnium zirconium oxide (Zr-rich HfZrO). The first anti-ferroelectric layer 321 and the second anti-ferroelectric layer 322 may include a zirconium-rich hafnium zirconium oxide (Zr-rich HfZrO) having a zirconium content and a hafnium content in a ratio of zirconium to hafnium of approximately 2:1. Other suitable materials for the first and second anti-ferroelectric layers 321 and 322 may include $PbZrO_3$, $PbHfO_3$, $PbMgWO_3$, $PbZrTiO_3$, $BiNaTiO_3$, $NaNbO_3$, and combinations thereof The ferroelectric layer 323 may include, for example, (Hf) hafnium and zirconium (Zr). The ferroelectric layer 323 may be made of an oxide including hafnium (Hf) and zirconium (Zr). The ferroelectric layer 323 may include a hafnium zirconium oxide (HfZrO) having a zirconium content and a hafnium content in a ratio of approximately 1:1. Other suitable materials for the ferroelectric layer 323 may include $BaTiO_3$, $PbTiO_3$, $BiFeO_3$, $SrTiO_3$, $PbMgNdO_3$, $PbMgNbTiO_3$, $PbZrNbTiO_3$, $PbZrTiO_3$, $KNbO_3$, $LiNbO_3$, GeTe, $LiTaO_3$, $KNaNbO_3$, $BaSrTiO_3$, and combinations thereof The interface layer 331 and the additional interface layer 332 may serve to suppress leakage current of the dielectric layer stack 320. The interface layer 331 may serve to protect the dielectric layer stack 320 when the second electrode 102 is formed. The interface layer 331 may include a material that is reduced prior to the dielectric layer stack 320 when the second electrode 102 is formed. The interface layer 331 and the additional interface layer 332 may function as a leakage current barrier having a large effective work function (eWF) and a large conduction band offset (CBO). Also, the interface layer 331 and the additional interface layer 332 may not increase the equivalent oxide film thickness $T_{ox}$ of the dielectric layer stack 320. The interface layer 331 may serve as a portion of the second electrode 102.

The interface layer 331 and the additional interface layer 332 may be the same material. The interface layer 331 and the additional interface layer 332 may have the same thickness. The interface layer 331 and the additional interface layer 332 may be thinner than the first and second anti-ferroelectric layers 321 and 322 and the ferroelectric layer 323.

The additional interface layer 332 may be a material having a large electronegativity. The additional interface layer 332 may have a larger Pauling electronegativity than the dielectric layer stack 320. The additional interface layer 332 may include a material having a larger Pauling electronegativity (which is, hereinafter, simply referred to as 'electronegativity') than the first and second anti-ferroelectric layers 321 and 322 and the ferroelectric layer 323. The additional interface layer 332 may have a sufficiently large electronegativity so that it may be hardly oxidized and readily reduced.

The interface layer 331 and the additional interface layer 332 may include atoms having a large electronegativity, such as metal atoms, silicon atoms, or germanium atoms. The interface layer 331 may include, for example, titanium (Ti), tantalum (Ta), aluminum (Al), tin (Sn), molybdenum (Mo), ruthenium (Ru), iridium (Ir), niobium (Nb), germanium (Ge), silicon (Si), nickel (Ni), or a combination thereof.

The interface layer 331 and the additional interface layer 332 may include titanium oxide, tantalum oxide, niobium oxide, aluminum oxide, silicon oxide ($SiO_2$), tin oxide, germanium oxide, molybdenum dioxide, molybdenum trioxide, iridium oxide, ruthenium oxide, nickel oxide or a combination thereof. According to another embodiment of the present invention, the interface layer 331 may include a stack of molybdenum and molybdenum nitride (Mo/MoN) or a stack of tungsten and tungsten nitride (W/WN).

Figure 6:
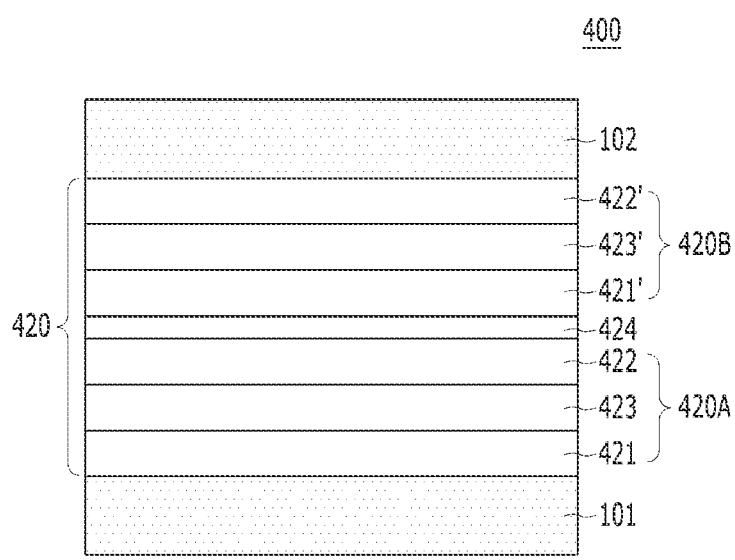

FIG. 6 illustrates a semiconductor device 400 in accordance with another embodiment of the present invention. The semiconductor device 400 of FIG. 6 may be similar to the semiconductor device 100 of FIG. 1. The semiconductor device 400 may be a portion of a memory. The semiconductor device 400 may be a portion of a volatile memory. The semiconductor device 400 may be a portion of a DRAM. The semiconductor device 400 may include a DRAM capacitor.

Referring to FIG. 6, the semiconductor device 400 may include the first electrode 101, the second electrode 102, and a dielectric layer stack 420 between the first electrode 101 and the second electrode 102. Hereinafter, as for detailed description on the first electrode 101 and the second electrode 102, FIG. 1 and the description thereof may be referred to.

The dielectric layer stack 420 may include at least one anti-ferroelectric layer and at least one ferroelectric layer. The dielectric layer stack 420 may include a first stack 420A and a second stack 420B. The dielectric layer stack 420 may further include a high band gap layer 424 disposed between the first stack 420A and the second stack 420B.

The stack 420A may include a multi-layer stack of different dielectric materials. The stack 420A may include a triple stack including a first anti-ferroelectric layer 421, a second anti-ferroelectric layer 422, and a ferroelectric layer 423. The ferroelectric layer 423 may be positioned between the first anti-ferroelectric layer 421 and the second anti-ferroelectric layer 422. The first anti-ferroelectric layer 421 and the second anti-ferroelectric layer 422 may be the same anti-ferroelectric material or different anti-ferroelectric materials. The first anti-ferroelectric layer 421 and the second anti-ferroelectric layer 422 may include, for example, (Hf) hafnium and zirconium (Zr). The first anti-ferroelectric layer 421 and the second anti-ferroelectric layer 422 may be made of an oxide including hafnium (Hf) and zirconium (Zr). The first anti-ferroelectric layer 421 and the second anti-ferroelectric layer 422 may include a zirconium-rich hafnium zirconium oxide (Zr-rich HfZrO). The first anti-ferroelectric layer 421 and the second anti-ferroelectric layer 422 may include a zirconium-rich hafnium zirconium oxide (Zr-rich HfZrO) having a zirconium content and a hafnium content of approximately 2:1. Other suitable materials for the first and second anti-ferroelectric layers 421 and 422 may include $PbZrO_3$, $PbHfO_3$, $PbMgWO_3$, $PbZrTiO_3$, $BiNaTiO_3$, $NaNbO_3$, and combinations thereof. The ferroelectric layer 423 may include, for example, (Hf) hafnium and zirconium (Zr). The ferroelectric layer 423 may be made of an oxide including hafnium (Hf) and zirconium (Zr). The ferroelectric layer 423 may include a hafnium zirconium oxide (HfZrO) having a zirconium content and a hafnium content at a ratio of approximately 1:1. Other suitable materials for the ferroelectric layer 423 may include $BaTiO_3$, $PbTiO_3$, $BiFeO_3$, $SrTiO_3$, $PbMgNdO_3$, $PbMgNbTiO_3$, $PbZrNbTiO_3$, $PbZrTiO_3$, $KNbO_3$, $LiNbO_3$, GeTe, $LiTaO_3$, $KNaNbO_3$, $BaSrTiO_3$, and combinations thereof.

The second stack 420B may include a multi-layer stack of different dielectric materials. The second stack 420B may include a triple stack including a first anti-ferroelectric layer 421', a second anti-ferroelectric layer 422', and a ferroelectric layer 423'. The ferroelectric layer 423' may be positioned between the first anti-ferroelectric layer 421' and the second anti-ferroelectric layer 422'. The first anti-ferroelectric layer 421' and the second anti-ferroelectric layer 422' may be the same anti-ferroelectric material or different anti-ferroelectric materials. The first anti-ferroelectric layer 421' and the second anti-ferroelectric layer 422' may include, for example, (Hf) hafnium and zirconium (Zr). The first anti-ferroelectric layer 421' and the second anti-ferroelectric layer 422' may be made of an oxide including hafnium (Hf) and zirconium (Zr). The first anti-ferroelectric layer 421' and the second anti-ferroelectric layer 422' may include a zirconium-rich hafnium zirconium oxide (Zr-rich HfZrO). The first anti-ferroelectric layer 421' and the second anti-ferroelectric layer 422' may include a zirconium-rich hafnium zirconium oxide (Zr-rich HfZrO) having a zirconium content and a hafnium content of approximately 2:1. Other suitable materials for the first and second anti-ferroelectric layers 421', 422' may include $PbZrO_3$, $PbHfO_3$, $PbMgWO_3$, $PbZrTiO_3$, $BiNaTiO_3$ or $NaNbO_3$. The ferroelectric layer 423' may include, for example, (Hf) hafnium and zirconium (Zr). The ferroelectric layer 423' may be made of an oxide including hafnium (Hf) and zirconium (Zr). The ferroelectric layer 423' may include a hafnium zirconium oxide (HfZrO) having a zirconium content and a hafnium content of approximately 1:1. Other suitable materials for the ferroelectric layer 423' may include $BaTiO_3$, $PbTiO_3$, $BiFeO_3$, $SrTiO_3$, $PbMgNdO_3$, $PbMgNbTiO_3$, $PbZrNbTiO_3$, $PbZrTiO_3$, $KNbO_3$, $LiNbO_3$, GeTe, $LiTaO_3$, $KNaNbO_3$, $BaSrTiO_3$, and combinations thereof.

The height (thickness) of the first stack 420A and the height (thickness) of the second stack 420B may be the same or different. The first stack 420A and the second stack 420B may have the same structure.

In this embodiment, the first stack 420A and the second stack 420B may each have a triple stack structure including two anti-ferroelectric layers and one ferroelectric layer. The first anti-ferroelectric layer 421 of the first stack 420A and the first anti-ferroelectric layer 421' of the second stack 420B may be made of the same anti-ferroelectric material or different anti-ferroelectric materials. The second anti-ferroelectric layer 422 of the first stack 420A and the second anti-ferroelectric layer 422' of the second stack 420B may be made of the same anti-ferroelectric material or different anti-ferroelectric materials. The ferroelectric layer 423 of the first stack 420A and the ferroelectric layer 423' of the second stack 420B may be made of the same ferroelectric material or different ferroelectric materials.

The first anti-ferroelectric layers 421 and 421' and the second anti-ferroelectric layers 422 and 422' may include a zirconium-rich hafnium zirconium oxide (Zr-rich HfZrO). The first anti-ferroelectric layers 421 and 421' and the second anti-ferroelectric layers 422 and 422' may include a zirconium-rich hafnium zirconium oxide (Zr-rich HfZrO) having a zirconium content and a hafnium content at a ratio of zirconium to hafnium of approximately 2:1. Other suitable materials for the first anti-ferroelectric layers 421 and 421' and the second anti-ferroelectric layers 422 and 422' may include $PbZrO_3$, $PbHfO_3$, $PbMgWO_3$, $PbZrTiO_3$, $BiNaTiO_3$, $NaNbO_3$, and combinations thereof. The ferroelectric layers 423 and 423' may include a hafnium zirconium oxide (HfZrO) having a zirconium content and a hafnium content at a ratio of approximately 1:1. Other suitable materials for the ferroelectric layers 423 and 423' may include BaTiO₃, PbTiO₃, BiFeO₃, SrTiO₃, PbMgNdO₃, PbMgNbTiO₃, PbZrNbTiO₃, PbZrTiO₃, KNbO₃, LiNbO₃, GeTe, LiTaO₃, KNaNbO₃, BaSrTiO₃, and combinations thereof.

The high band gap layer 424 may serve to prevent leakage current of the dielectric layer stack 420. The high band gap layer 424 may include a high energy band gap material. The high band gap layer 424 may have an energy band gap of from approximately 8.8 eV to approximately 10.6 eV. The high band gap layer 424 may include a material having a higher energy band gap than the first stack 420A and the second stack 420B. The high band gap layer 424 may include a material having a higher energy band gap than the first anti-ferroelectric layers 421 and 421', the second anti-ferroelectric layers 422 and 422', and the ferroelectric layers 423 and 423'. The high band gap layer 424 may include a material that is different from the first stack 420A and the second stack 420B. The high band gap layer 424 may include a high-k material, but may have a lower dielectric constant than the first stack 420A and the second stack 420B. The high band gap layer 424 may have a higher dielectric constant than silicon oxide and silicon nitride. The high band gap layer 424 may include aluminum oxide or beryllium oxide. The high band gap layer 424 may be thinner than the first stack 420A and the second stack 420B. Since the high band gap layer 424 has a relatively low dielectric constant compared to the dielectric constant of the first stack 420A and the second stack 420B, the high band gap layer 424 may be formed to be extremely thin to increase capacitance.

Figure 7:
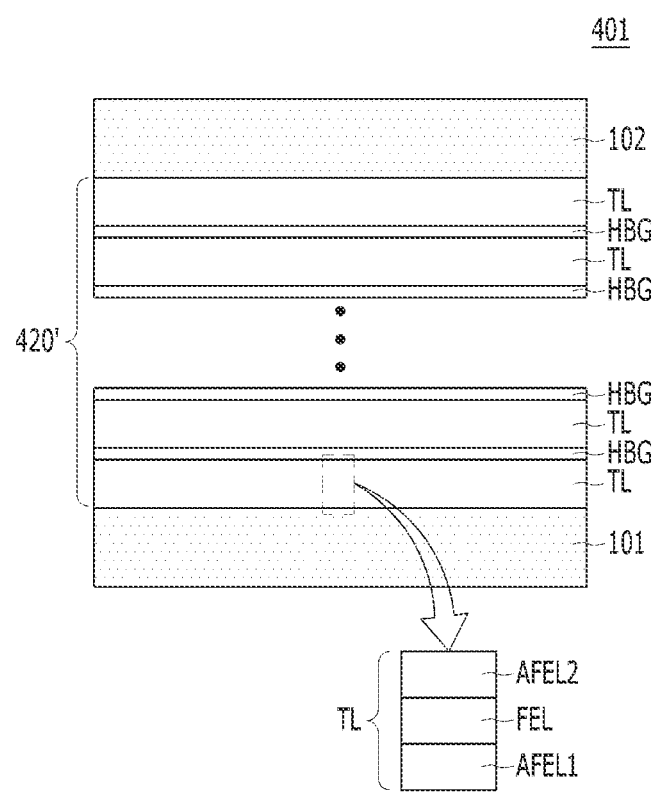

FIG. 7 illustrates a semiconductor device 401 in accordance with another embodiment of the present invention. The semiconductor device 401 of FIG. 7 may be similar to the semiconductor device 400 of FIG. 6. The semiconductor device 401 may be a portion of a memory. The semiconductor device 401 may be a portion of a volatile memory. The semiconductor device 401 may be a portion of a DRAM. The semiconductor device 401 may include a DRAM capacitor.

Referring to FIG. 7, the semiconductor device 401 may include the first electrode 101, the second electrode 102, and a dielectric layer stack 420' between the first electrode 101 and the second electrode 102. Hereinafter, as for the detailed descriptions on the first electrode 101 and the second electrode 102, FIG. 1 and the description thereof may be referred to.

The dielectric layer stack 420' may include at least one anti-ferroelectric layer and at least one ferroelectric layer. The dielectric layer stack 420' may include at least one triple stack TL and at least one high band gap layer HBG. The dielectric layer stack 420' may be formed by alternately stacking the triple stack TL and the high band gap layer HBG at least two or more times. Accordingly, the dielectric layer stack 420' may be a stack including a plurality of alternating triple stacks TL and high band gap layers HBG. The bottom triple stack TL among the triple stacks TL may directly contact the first electrode 101, and the top triple stack TL among the triple stacks TL may directly contact the second electrode 102. The high band gap layer HBG may not directly contact the first electrode 101 and the second electrode 102. According to another embodiment of the present invention, a high band gap layer HBG may be added between the top triple stack TL and the second electrode 102.

The triple stack TL may correspond to the first stack 420A or the second stack 420B of FIG. 6. The triple stack TL may have a structure in which a ferroelectric layer is positioned between anti-ferroelectric layers. The high band gap layer HBG may correspond to the high band gap layer 424 of FIG. 6.

The triple stack TL may include a first anti-ferroelectric layer AFEL1, a second anti-ferroelectric layer AFEL2, and a ferroelectric layer FEL disposed between the first anti-ferroelectric layer AFEL1 and the second anti-ferroelectric layer AFEL2. The first anti-ferroelectric layer AFEL1 and the second anti-ferroelectric layer AFEL2 may be made of the same anti-ferroelectric material or different anti-ferroelectric materials. The first anti-ferroelectric layer AFEL1 and the second anti-ferroelectric layer AFEL2 may include, for example, (Hf) hafnium and zirconium (Zr). The first anti-ferroelectric layer AFEL1 and the second anti-ferroelectric layer AFEL2 may be made of an oxide including hafnium (Hf) and zirconium (Zr). The first anti-ferroelectric layer AFEL1 and the second anti-ferroelectric layer AFEL2 may include a zirconium-rich hafnium zirconium oxide (Zr-rich HfZrO). The first anti-ferroelectric layer AFEL1 and the second anti-ferroelectric layer AFEL2 may include a zirconium-rich hafnium zirconium oxide (Zr-rich HfZrO) having a zirconium content and a hafnium content at a ratio of zirconium to hafnium at approximately 2:1. According to another embodiment of the present invention, the first and second anti-ferroelectric layers AFEL1 and AFEL2 may be made of other suitable materials including PbZrO₃, PbHfO₃, PbMgWO₃, PbZrTiO₃, BiNaTiO₃ NaNbO₃, and combinations thereof. The ferroelectric layer FEL may include, for example, (Hf) hafnium and zirconium (Zr). The ferroelectric layer FEL may be made of an oxide including hafnium (Hf) and zirconium (Zr). The ferroelectric layer FEL may include a hafnium zirconium oxide (HfZrO) having a zirconium content and a hafnium content at a ratio of approximately 1:1. According to another embodiment of the present invention, the ferroelectric layer FEL may be made of other suitable materials including BaTiO₃, PbTiO₃, BiFeO₃, SrTiO₃, PbMgNdO₃, PbMgNbTiO₃, PbZrNbTiO₃, PbZrTiO₃, KNbO₃, LiNbO₃, GeTe, LiTaO₃, KNaNbO₃, BaSrTiO₃, and combinations thereof The high band gap layer HBG may serve to prevent the leakage current of the dielectric layer stack 420'. The high band gap layer HBG may include a high energy band gap material. The high band gap layer HBG may have an energy band gap of from approximately 8.8 eV to approximately 10.6 eV. The high band gap layer HBG may include a material having a higher energy band gap than the triple stack TL. The high band gap layer HBG may include a material having a higher energy band gap than the first and second anti-ferroelectric layers AFEL1 and AFEL2 and the ferroelectric layer FEL. The high band gap layer HBG may include a material that is different from the triple stack TL. The high band gap layer HBG may include a high-k material, but may have a lower dielectric constant than the triple stack TL. The high band gap layer HBG may have a higher dielectric constant than silicon oxide and silicon nitride. The high band gap layer HBG may include aluminum oxide or beryllium oxide. The high band gap layer HBG may be thinner than the triple stack TL. Since the high band gap layer HBG has a relatively lower dielectric constant than the triple stack TL, the high band gap layer HBG may be formed to be extremely thin to increase capacitance.

Figure 8A:
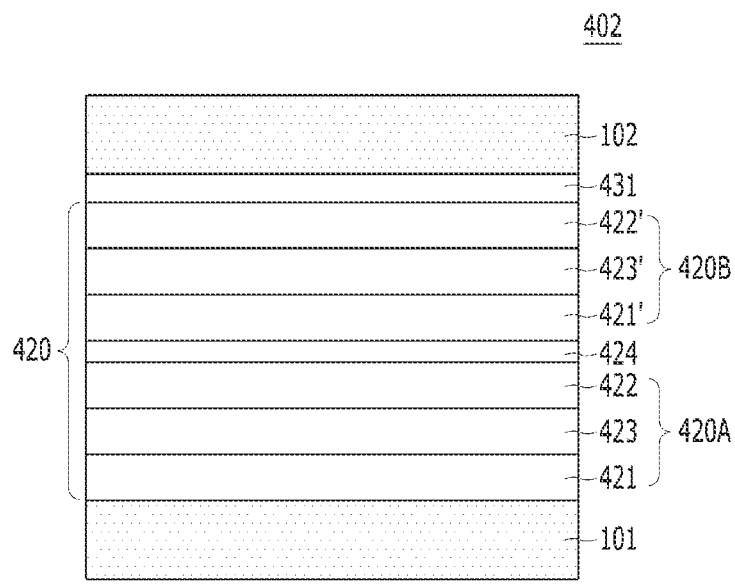
Figure 8B:
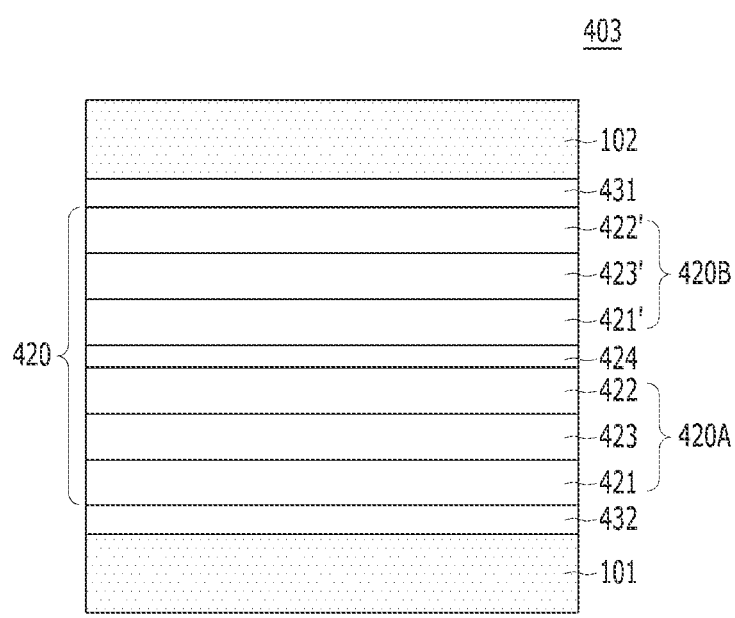

FIGS. 8A and 8B illustrate semiconductor devices in accordance with other embodiments of the present invention. The semiconductor device 402 of FIG. 8A and the semiconductor device 403 of FIG. 8B may be similar to the semiconductor device 400 of FIG. 6. Each of the semiconductor devices 402 and 403 may be a portion of the memory. Each of the semiconductor devices 402 and 403 may be a portion of a volatile memory. Each of the semiconductor devices 402 and 403 may be a portion of a DRAM. Each of the semiconductor devices 402 and 403 may include a DRAM capacitor.

Referring to FIG. 8A, the semiconductor device 402 may include the first electrode 101, the second electrode 102, the dielectric layer stack 420 between the first electrode 101 and the second electrode 102, and an interface layer 431 between the second electrode 102 and the dielectric layer stack 420.

The dielectric layer stack 420 may include the first stack 420A, the second stack 420B, and the high band gap layer 424 disposed between the first stack 420A and the second stack 420B. The first stack 420A may include the first anti-ferroelectric layer 421, the second anti-ferroelectric layer 422, and the ferroelectric layer 423 disposed between the first anti-ferroelectric layer 421 and the second anti-ferroelectric layer 422. The second stack 420B may include the first anti-ferroelectric layer 421', the second anti-ferroelectric layer 422', and the ferroelectric layer 423' disposed between the first anti-ferroelectric layer 421' and the second anti-ferroelectric layer 422'.

Hereinafter, detailed descriptions on the first electrode 101, the second electrode 102, and the dielectric layer stack 420 will be described with reference to the above-described embodiments of the present invention.

The interface layer 431 may correspond to the interface layer 331 of FIG. 4.

The interface layer 431 may be positioned between the second stack 420B and the second electrode 102. The interface layer 431 may be a material having a large electronegativity. The interface layer 431 may have a higher Pauling Electronegativity than the dielectric layer stack 420. The interface layer 431 may include a material having a larger electronegativity than the first anti-ferroelectric layers 421 and 421', the second anti-ferroelectric layers 422 and 422', and the ferroelectric layers 423 and 423'. Accordingly, the interface layer 431 may prevent oxygen loss of the dielectric layer stack 420.

The interface layer 431 may include atoms having large electronegativity, such as metal atoms, silicon atoms, or germanium atoms. The interface layer 431 may include, for example, titanium (Ti), tantalum (Ta), aluminum (Al), tin (Sn), molybdenum (Mo), ruthenium (Ru), iridium (Ir), niobium (Nb), germanium (Ge), silicon (Si), nickel (Ni), or a combination thereof.

The interface layer 431 may include titanium oxide, tantalum oxide, niobium oxide, aluminum oxide, silicon oxide ($SiO_2$), tin oxide, germanium oxide, molybdenum dioxide, molybdenum trioxide, iridium oxide, ruthenium oxide, nickel oxide or a combination thereof. According to another embodiment of the present invention, the interface layer 431 may include a stack of molybdenum and molybdenum nitride (Mo/MoN) or a stack of tungsten and tungsten nitride (W/WN).

The semiconductor device 403 of FIG. 8B may have the same constituent elements as those of the semiconductor device 402 of FIG. 8A, except for an additional interface layer 432.

The semiconductor device 403 may include the first electrode 101, the second electrode 102, the dielectric layer stack 420 disposed between the first electrode 101 and the second electrode 102, the interface layer 431 between the second electrode 102 and the dielectric layer stack 420, and an additional interface layer 432 disposed between the first electrode 101 and the dielectric layer stack 420.

The additional interface layer 432 and the interface layer 431 may serve to suppress leakage current of the dielectric layer stack 420. The interface layer 431 may serve to protect the dielectric layer stack 420 when the second electrode 102 is formed. The interface layer 431 may include a material that is reduced prior to the dielectric layer stack 420 when the second electrode 102 is formed. The interface layer 431 and the additional interface layer 432 may serve as a large leakage current barrier having a large effective work function (eWF) and a large conduction band offset (CBO). Also, the interface layer 431 and the additional interface layer 432 may not increase the equivalent oxide film thickness $T_{ox}$ of the dielectric layer stack 420. The interface layer 431 may serve as a portion of the second electrode 102.

The interface layer 431 and the additional interface layer 432 may be made of the same material. The interface layer 431 and the additional interface layer 432 may have the same thickness. The interface layer 431 and the additional interface layer 432 may be thinner than the first and second anti-ferroelectric layers 421 and 422 and the ferroelectric layer 423.

The additional interface layer 432 may be a material having a large electronegativity. The additional interface layer 432 may have a larger Pauling electronegativity than the dielectric layer stack 420. The additional interface layer 432 may include a material having a greater electronegativity than the first anti-ferroelectric layers 421 and 421', the second anti-ferroelectric layers 422 and 422', and the ferroelectric layers 423 and 423'.

The additional interface layer 432 may include atoms having a large electronegativity, such as metal atoms, silicon atoms, or germanium atoms. The interface layer 331 may include, for example, titanium (Ti), tantalum (Ta), aluminum (Al), tin (Sn), molybdenum (Mo), ruthenium (Ru), iridium (Ir), niobium (Nb), germanium (Ge), silicon (Si), nickel (Ni), or a combination thereof.

The additional interface layer 432 may include titanium oxide, tantalum oxide, niobium oxide, aluminum oxide, silicon oxide ($SiO_2$), tin oxide, germanium oxide, molybdenum dioxide, molybdenum trioxide, iridium oxide, ruthenium oxide, nickel oxide, or a combination thereof.

According to another embodiment of the present invention, the dielectric layer stack 420 of the semiconductor devices 402 and 403 may be replaced with an alternating stack corresponding to the dielectric layer stack 420' of FIG. 7.

Figure 9A:
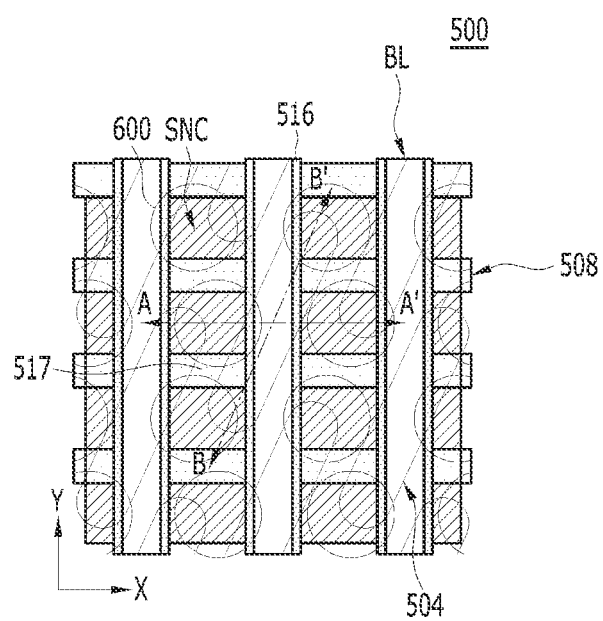
FIGS. 9A to 9C are diagrams illustrating memory cells.
Figure 9B:
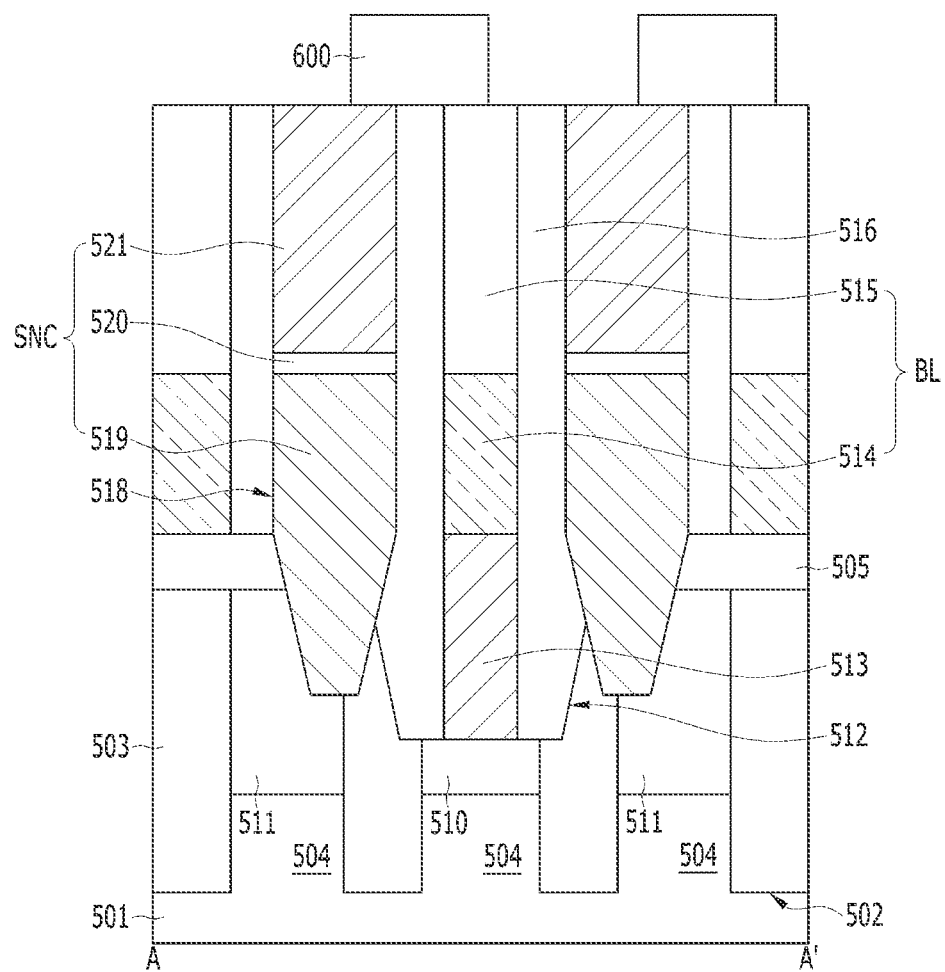
Figure 9C:
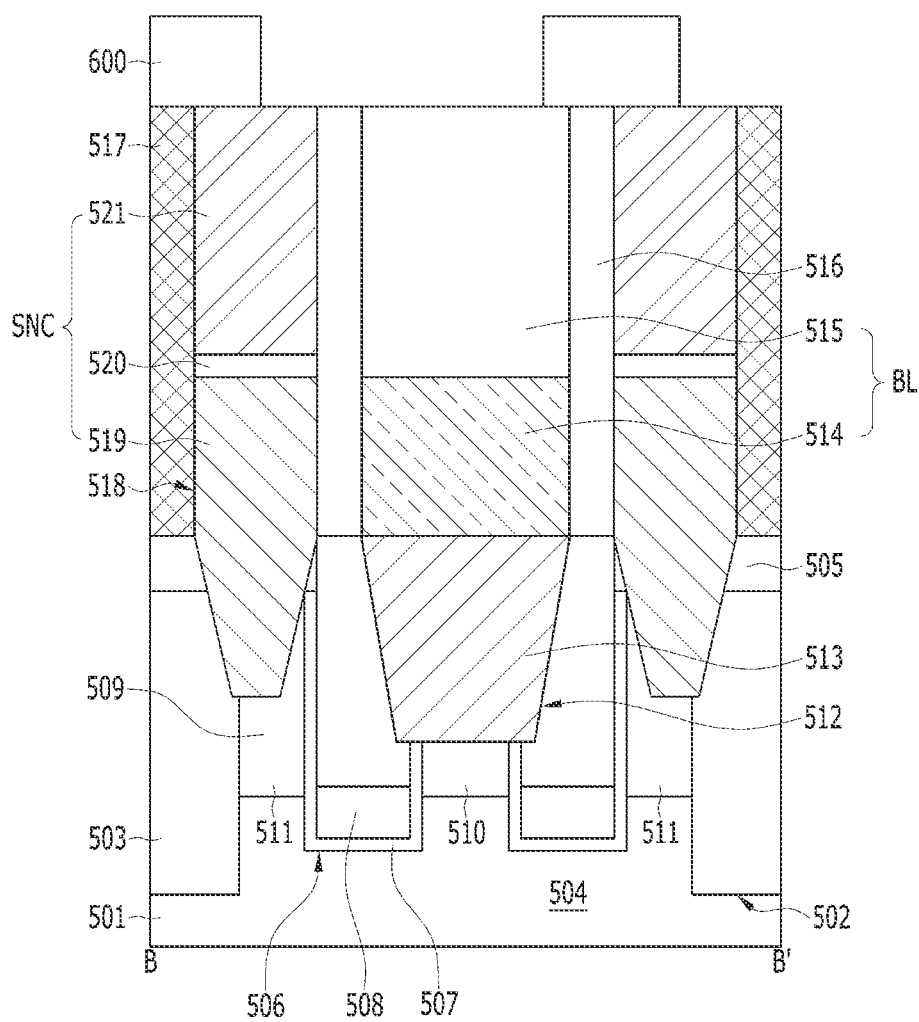

FIGS. 9A to 9C are diagrams illustrating memory cells. FIG. 9B is a cross-sectional view taken along a line A-A' in FIG. 9A. FIG. 9C is a cross-sectional view taken along a line B-B' in FIG. 9A.

The memory cell 500 may include a cell transistor including a buried word line 508, a bit line 514, and a capacitor 600. The capacitor 600 may include a dielectric layer stack, and the dielectric layer stack may include one among the dielectric layer stacks of the above-described embodiments of the present invention.

The memory cell 500 will now be described in detail.

An isolation layer 503 and an active region 504 may be formed over the substrate 501. A plurality of active regions 504 may be defined by the isolation layer 503. The substrate 501 may be a material appropriate for semiconductor processing. The substrate 501 may include a semiconductor substrate. The substrate 501 may be formed of a material containing silicon. The substrate 501 may include, for example, silicon, monocrystalline silicon, polysilicon, amorphous silicon, silicon germanium, monocrystalline silicon germanium, polycrystalline silicon germanium, carbon-doped silicon, combinations thereof, or multi-layers thereof. The substrate 501 may also include other semiconductor materials, such as germanium. The substrate 501 may include a group-III/V semiconductor substrate, for example, a compound semiconductor substrate, such as GaAs. The substrate 501 may include a Silicon On Insulator (SOI) substrate. The isolation layer 503 may be formed in an isolation trench 502 by a Shallow Trench Isolation (STI) process.

A word line trench 506 may be formed in the substrate 501. The word line trench 506 may be referred to as a gate trench. A gate dielectric layer 507 may be formed on the surface of the word line trench 506. A buried word line 508 partially filling the word line trench 506 may be formed over the gate dielectric layer 507. The buried word line 508 may be referred to as a buried gate electrode. A word line capping layer 509 may be formed over the buried word line 508. The top surface of the buried word line 508 may be positioned at a lower level than the surface of the substrate 501. The buried word line 508 may be made of a low resistance metal material. The buried word line 508 may be made of a stack in which titanium nitride and tungsten are sequentially stacked. According to another embodiment of the present invention, the buried word line 508 may be formed of titanium nitride only (TiN Only).

First and second impurity regions 510 and 511 may be formed in the substrate 501. The first and second impurity regions 510 and 511 may be spaced apart from each other by the word line trench 506. The first and second impurity regions 510 and 511 may be referred to as first and second source/drain regions. The first and second impurity regions 510 and 511 may include an N-type impurity such as arsenic (As) or phosphorus (P). Accordingly, the buried word line 508 and the first and second impurity regions 510 and 511 may become a cell transistor. The cell transistor may improve a short channel effect by the buried word line 508.

A bit line contact plug 513 may be formed over the substrate 501. The bit line contact plug 513 may be coupled to the first impurity region 510. The bit line contact plug 513 may be positioned in a bit line contact hole 512. The bit line contact hole 512 may be formed using the hard mask layer 505. The hard mask layer 505 may be formed over the substrate 501. The bit line contact hole 512 may expose the first impurity region 510. The bottom surface of the bit line contact plug 513 may be lower than the top surface of the substrate 501. The bit line contact plug 513 may be formed, for example, of polysilicon or a metal material. A portion of the bit line contact plug 513 may have a line width which is smaller than the diameter of the bit line contact hole 512. A bit line 514 may be formed over the bit line contact plug 513. A bit line hard mask 515 may be formed over the bit line 514. The stacked structure of the bit line 514 and the bit line hard mask 515 may be referred to as a bit line structure BL. The bit line 514 may have a line shape extending in a direction intersecting with the buried word line 508. A portion of the bit line 514 may be coupled to the bit line contact plug 513. The bit line 514 may include a metal material. The bit line hard mask 515 may include a dielectric material.

A bit liner spacer 516 may be formed on a sidewall of the bit line structure BL. The bottom portion of the bit liner spacer 516 may extend to be formed on both sides of the bit line contact plug 513. The bit liner spacer 516 may include, for example, silicon oxide, silicon nitride, or a combination thereof. According to another embodiment of the present invention, the bit liner spacer 516 may include an air gap. For example, it may be a NAN (Nitride-Air gap-Nitride) structure in which an air gap is positioned between silicon nitrides.

A storage node contact plug SNC may be formed between the neighboring bit line structures BL. The storage node contact plug SNC may be formed in a storage node contact hole 518. The storage node contact plug SNC may be coupled to the second impurity region 511. The storage node contact plug SNC may include a lower plug 519 and an upper plug 521. The storage node contact plug SNC may further include an ohmic contact layer 520 disposed between the lower plug 519 and the upper plug 521. The ohmic contact layer 520 may include a metal silicide. The upper plug 521 may include a metal material, and the lower plug 519 may include a silicon-containing material.

From the perspective of a direction parallel to the bit line structure BL, a plug isolation layer 517 may be formed between the neighboring storage node contact plugs SNCs. The plug isolation layer 517 may be formed between the neighboring bit line structures BL and may provide a storage node contact hole 518 together with the hard mask layer 505.

The capacitor 600 may be coupled to the storage node contact plug SNC.

FIGS. 10A to 10F are diagrams illustrating application examples of the capacitor 600 of a memory cell. Hereinafter, the lower electrodes 601, 601P, and 601L may correspond to the first electrode 101 of the above-described embodiments of the present invention, and the upper electrode 602 may correspond to the second electrode 102.

Figure 10A:
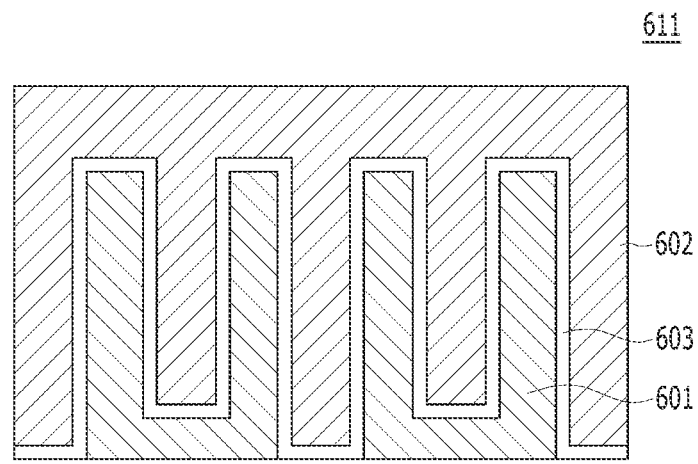
FIGS. 10A to 10F are diagrams illustrating application examples of a capacitor of a memory cell.

Referring to FIG. 10A, a capacitor 611 may include a lower electrode 601, a dielectric layer stack 603, and an upper electrode 602. The lower electrode 601 may have a cylindrical shape. The dielectric layer stack 603 may correspond to one among the dielectric layer stacks of the above-described embodiments. Accordingly, the dielectric layer stack 603 may include a first anti-ferroelectric layer, a second anti-ferroelectric layer, and a ferroelectric layer disposed between the first anti-ferroelectric layer and the second anti-ferroelectric layer. The dielectric layer stack 603 may include, for example, two zirconium-rich hafnium zirconium oxide layers and one hafnium zirconium oxide layer. The two zirconium-rich hafnium zirconium oxide layers may include a zirconium-rich hafnium zirconium oxide (Zr-rich HfZrO) having a zirconium content and a hafnium content at a ratio of zirconium to hafnium of approximately 2:1. One hafnium zirconium oxide layer may include a hafnium zirconium oxide having a zirconium content and a hafnium content at a ratio of approximately 1:1.

Hereinafter, detailed descriptions on the parts of FIGS. 10B to 10F overlapping with those of the embodiment of FIG. 10A may be omitted.

Figure 10B:
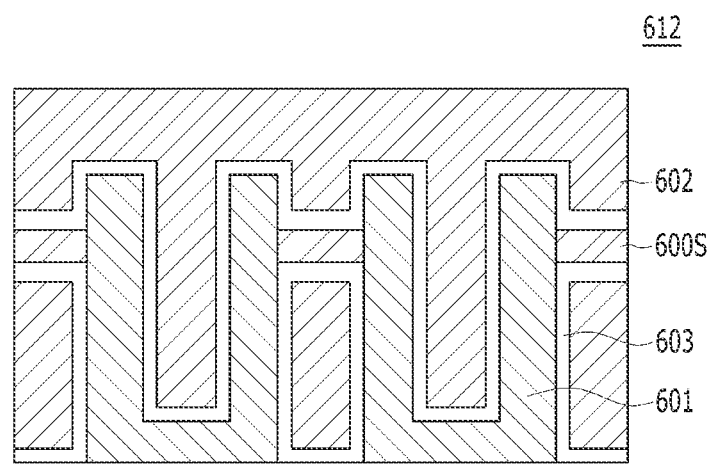

Referring to FIG. 10B, a capacitor 612 may include a lower electrode 601, a dielectric layer stack 603, and an upper electrode 602 that are formed in a cylinder shape. The capacitor 612 may further include a supporter 600S. The supporter 600S may be a structure that supports the outer wall of the lower electrode 601. The supporter 600S may include, for example, silicon nitride. According to another embodiment of the present invention, a multi-level supporter formed of a plurality of supporters 600S may support the lower electrode 601. For example, the multi-level supporter may be a two-level supporter structure formed of a lower-level supporter and an upper-level supporter. Also, the multi-level supporter may be a three-level supporter structure formed of a lower-level supporter, a middle-level supporter, and an upper-level supporter.

Figure 10C:
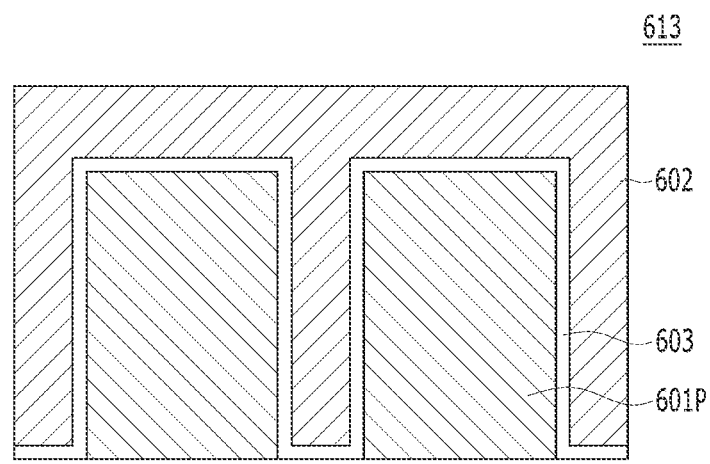
Figure 10D:
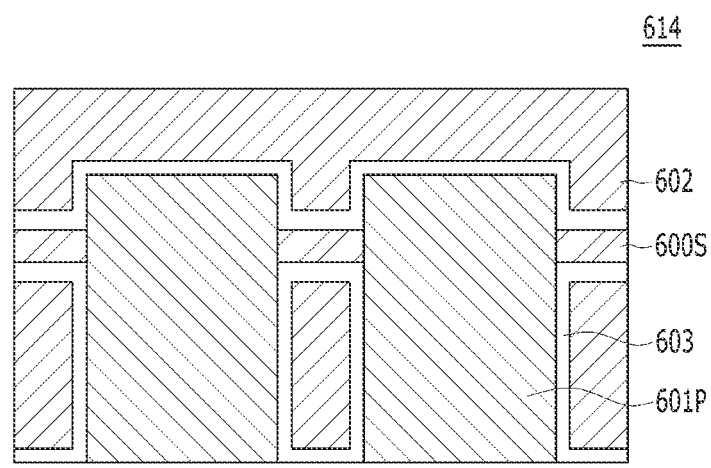

Referring to FIGS. 10C and 10D, capacitors 613 and 614 may include a lower electrode 601P, a dielectric layer stack 603, and an upper electrode 602 with the lower electrode having a pillar shape. The capacitor 614 of FIG. 10D may further include a supporter 600S.

Figure 10E:
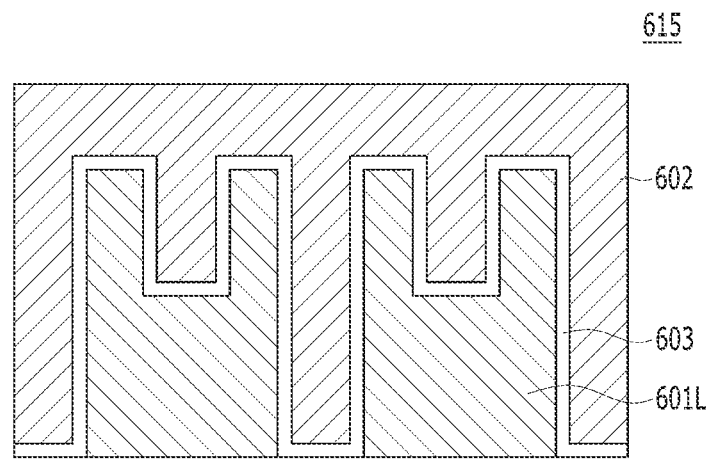
Figure 10F:
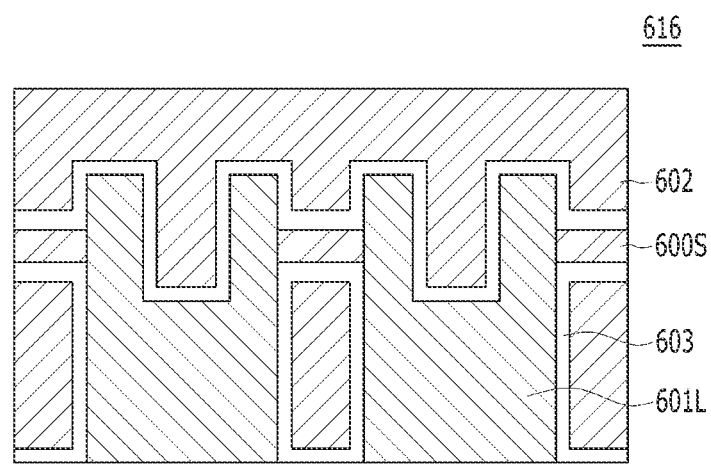

Referring to FIGS. 10E and 10F, capacitors 615 and 616 may include a lower electrode 601L, a dielectric layer stack 603, and an upper electrode 602 with the lower electrode having a pillar shape (FIG. 10E) or a hybrid pillar-cylinder shape (FIG. 10F). The capacitor 616 of FIG. 10F may further include a supporter 600S. The lower electrode 601L may be a hybrid structure in which a pillar shape and a cylinder shape are merged. More specifically, the lower electrode 601L may have a lower part that has pillar shape and an upper part which has a cylinder shape. This hybrid structure of a pillar shape and a cylinder shape may be referred to simply as a hybrid pillar-cylinder shape. In an embodiment, the supporter 600S may be in contact with the cylinder part of the lower electrode 601L.

The dielectric layer stack in accordance with the above-described embodiments of the present invention may be applied to a peripheral circuit of a DRAM. For example, the DRAM may include a memory cell region including memory cells (500 in FIG. 9A) and a peripheral circuit region including a peripheral transistor. The gate dielectric layer of the peripheral transistor may include one among the dielectric layer stacks of the above-described embodiments of the present invention. For example, the gate dielectric layer of the peripheral transistor may include a first anti-ferroelectric layer, a second anti-ferroelectric layer, and a ferroelectric layer between the first anti-ferroelectric layer and the second anti-ferroelectric layer. The gate dielectric layer of the peripheral transistor may include two zirconium-rich hafnium zirconium oxide layers and one hafnium zirconium oxide layer. The two zirconium-rich hafnium zirconium oxide layers may include a zirconium-rich hafnium zirconium oxide (Zr-rich HfZrO) having a zirconium content and a hafnium content at a ratio of zirconium to hafnium of approximately 2:1. One hafnium zirconium oxide layer may include a hafnium zirconium oxide having a zirconium content and a hafnium content at a ratio of approximately 1:1.

Figure 11:
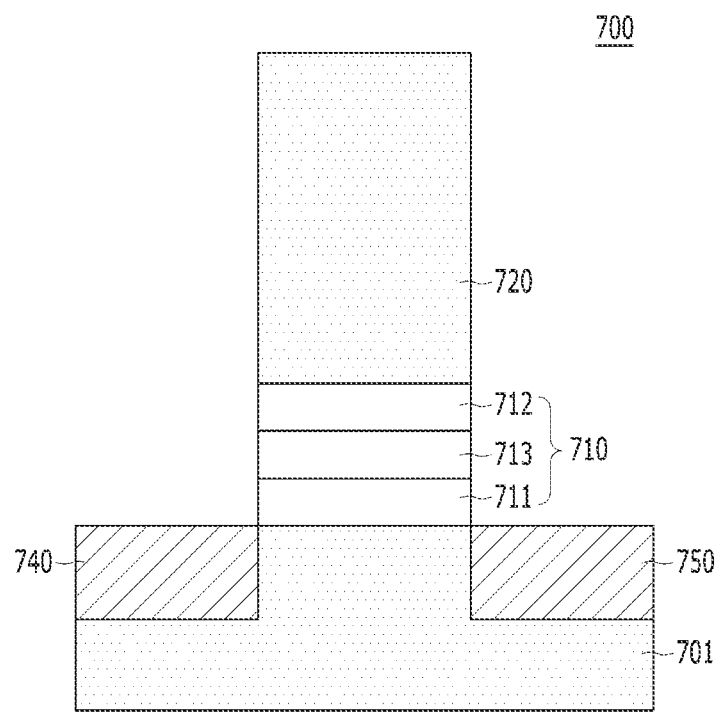
FIG. 11 is a cross-sectional view illustrating a semiconductor device in accordance with another embodiment of the present invention.

FIG. 11 is a cross-sectional view illustrating a semiconductor device in accordance with another embodiment of the present invention.

Referring to FIG. 11, the semiconductor device 700 may include a transistor. The semiconductor device 700 may include a semiconductor substrate 701, a gate dielectric layer 710, a gate electrode 720, a source region 740, and a drain region 750. The gate dielectric layer 710 may be formed over the semiconductor substrate 701, and the gate electrode 720 may be formed over the gate dielectric layer 710. The source region 740 and the drain region 750 may be formed in the semiconductor substrate 701.

The gate dielectric layer 710 may include one among the dielectric layer stacks in accordance with the above-described embodiments of the present invention. In this embodiment, the gate dielectric layer 710 may be a triple stack including a first anti-ferroelectric layer 711, a second anti-ferroelectric layer 712, and a ferroelectric layer 713 disposed between the first anti-ferroelectric layer 711 and the second anti-ferroelectric layer 712. The first anti-ferroelectric layer 711 and the second anti-ferroelectric layer 712 may be made of the same anti-ferroelectric material or different anti-ferroelectric materials. The first anti-ferroelectric layer 711 and the second anti-ferroelectric layer 712 may include, for example, (Hf) hafnium and zirconium (Zr). The first anti-ferroelectric layer 711 and the second anti-ferroelectric layer 712 may be made of an oxide including hafnium (Hf) and zirconium (Zr). The first anti-ferroelectric layer 711 and the second anti-ferroelectric layer 712 may include a zirconium-rich hafnium zirconium oxide (Zr-rich HfZrO). The first anti-ferroelectric layer 711 and the second anti-ferroelectric layer 712 may include a zirconium-rich hafnium zirconium oxide (Zr-rich HfZrO) having a zirconium content and a hafnium content of approximately 2:1. Other suitable materials for the first and second anti-ferroelectric layers 711 and 712 may include $PbZrO_3$, $PbHfO_3$, $PbMgWO_3$, $PbZrTiO_3$, $BiNaTiO_3$, $NaNbO_3$, and combinations thereof. The ferroelectric layer 713 may include, for example, (Hf) hafnium and zirconium (Zr). The ferroelectric layer 713 may be made of an oxide including hafnium (Hf) and zirconium (Zr). The ferroelectric layer 713 may include a hafnium zirconium oxide (HfZrO) having a zirconium content and a hafnium content at a ratio of approximately 1:1. Other suitable materials for the ferroelectric layer 713 may include $BaTiO_3$, $PbTiO_3$, $BiFeO_3$, $SrTiO_3$, $PbMgNdO_3$, $PbMgNbTiO_3$, $PbZrNbTiO_3$, $PbZrTiO_3$, $KNbO_3$, $LiNbO_3$, GeTe, $LiTaO_3$, $KNaNbO_3$, $BaSrTiO_3$, and combinations thereof.

The gate electrode 720 may be a metal gate electrode including a metal-based material. The gate electrode 720 may include, for example, tungsten, aluminum, tungsten nitride, titanium nitride, titanium, or a combination thereof.

The source region 740 and the drain region 750 may include an impurity of the same conductive type. The source region 740 and the drain region 750 may include an N-type impurity or a P-type impurity. The N-type impurity may include, for example, phosphorus or arsenic, and the P-type impurity may include boron or indium.

According to another embodiment of the present invention, a thin interface layer may be further formed between the gate dielectric layer 710 and the semiconductor substrate 701. The thin interface layer may include, for example, silicon oxide or silicon oxynitride.

According to another embodiment of the present invention, the gate dielectric layer 710 may be applied to the gate dielectric layer of a FinFET.

The dielectric layer stack in accordance with the above-described embodiments of the present invention may be applied to a metal-insulator-metal (MIM) capacitor. For example, the MIM capacitor may include a first metal electrode, a second metal electrode, and a dielectric layer stack formed between the first metal electrode and the second metal electrode. The dielectric layer stack of the MIM capacitor may include one among the dielectric layer stacks of the above-described embodiments of the present invention. For example, the dielectric layer stack may include a first anti-ferroelectric layer, a second anti-ferroelectric layer, and a ferroelectric layer disposed between the first anti-ferroelectric layer and the second anti-ferroelectric layer.

The dielectric layer stack in accordance with the above-described embodiments of the present invention may be applied to an embedded DRAM. For example, the embedded DRAM may include a logic circuit and a capacitor, and the capacitor of the embedded DRAM may include a lower electrode, a dielectric layer stack, and an upper electrode. The dielectric layer stack of the capacitor of the embedded DRAM may include one among the dielectric layer stacks of the above-described embodiments of the present invention. For example, the dielectric layer stack may include a first anti-ferroelectric layer, a second anti-ferroelectric layer, and a ferroelectric layer disposed between the first anti-ferroelectric layer and the second anti-ferroelectric layer.

The dielectric layer stack in accordance with the above-described embodiments of the present invention may be applied to a 3D NAND (Three-Dimensional NAND). For example, the 3D NAND may include a dielectric layer stack including a pillar-type channel layer, a word line surrounding the pillar-type channel layer, and a tunnel dielectric layer between the pillar-type channel layer and the word line. At least the tunnel dielectric layer of the dielectric layer stack of the 3D NAND may include at least one among the first anti-ferroelectric layer, the second anti-ferroelectric layer, and the ferroelectric layer of the above-described embodiments of the present invention.

According to the embodiment of the present invention, it is possible to control the switching voltage, capacitance, and polarization of a dielectric layer stack by controlling the composition ratio between a ferroelectric material and an anti-ferroelectric material. Accordingly, a volatile memory may be implemented.

While the present invention has been described with respect to specific embodiments, it will be apparent to those skilled in the art that various changes and modifications may be made without departing from the spirit and scope of the invention as defined in the following claims.

What is claimed is:

1. A semiconductor device, comprising:
a first electrode;
a second electrode; and
a dielectric layer stack disposed between the first electrode and the second electrode;
an interface layer disposed between the dielectric layer stack and the second electrode; and
an additional interface layer disposed between the first electrode and the dielectric layer stack,
wherein the dielectric layer stack includes:
a first stack;
a second stack; and
a high band gap layer disposed between the first stack and the second stack,
wherein each of the first stack and the second stack includes a first anti-ferroelectric layer, a second anti-ferroelectric layer, and a ferroelectric layer disposed between the first anti-ferroelectric layer and the second anti-ferroelectric layer.

2. The semiconductor device of claim 1, wherein the first anti-ferroelectric layer, the ferroelectric layer, and the second anti-ferroelectric layer are vertically arranged between the first electrode and the second electrode.

3. The semiconductor device of claim 1, wherein the first anti-ferroelectric layer and the second anti-ferroelectric layer include the same anti-ferroelectric material or different anti-ferroelectric materials.

4. The semiconductor device of claim 1, wherein the first anti-ferroelectric layer, the second anti-ferroelectric layer, and the ferroelectric layer include an oxide containing hafnium, zirconium and oxygen.

5. The semiconductor device of claim 1, wherein the first anti-ferroelectric layer and the second anti-ferroelectric layer include an anti-ferroelectric hafnium zirconium oxide, and the ferroelectric layer includes a ferroelectric hafnium zirconium oxide.

6. The semiconductor device of claim 1, wherein the first anti-ferroelectric layer and the second anti-ferroelectric layer include a hafnium zirconium oxide having a zirconium content greater than a hafnium content.

7. The semiconductor device of claim 1, wherein the ferroelectric layer includes a hafnium zirconium oxide whose hafnium content and zirconium content are the same.

8. The semiconductor device of claim 1, wherein each of the first anti-ferroelectric layer, the second anti-ferroelectric layer, and the ferroelectric layer includes a hafnium zirconium oxide, and
the first anti-ferroelectric layer and the second anti-ferroelectric layer have a zirconium content at least twice as much as a hafnium content, and
the ferroelectric layer has a hafnium content and a zirconium content in a ratio of approximately 1:1.

9. The semiconductor device of claim 1, wherein the first anti-ferroelectric layer and the second anti-ferroelectric layer include $PbZrO_3$, $PbHfO_3$, $PbMgWO_3$, $PbZrTiO_3$, $BiNaTiO_3$ or $NaNbO_3$.

10. The semiconductor device of claim 1, wherein the ferroelectric layer includes $BaTiO_3$, $PbTiO_3$, $BiFeO_3$, $SrTiO_3$, $PbMgNdO_3$, $PbMgNbTiO_3$, $PbZrNbTiO_3$, $PbZrTiO_3$, $KNbO_3$, $LiNbO_3$, $GeTe$, $LiTaO_3$, $KNaNbO_3$, or $BaSrTiO_3$.

11. The semiconductor device of claim 1, wherein the interface layer includes a material that is reduced prior to the dielectric layer stack.

12. The semiconductor device of claim 1, wherein the interface layer and the additional interface layer include a material having a greater electronegativity than the first and second anti-ferroelectric layers and the ferroelectric layer.

13. The semiconductor device of claim 1, wherein the interface layer and the additional interface layer include titanium oxide, tantalum oxide, niobium oxide, or tin oxide.

14. The semiconductor device of claim 1, wherein the high band gap layer includes a material having a higher energy band gap than the first stack and the second stack.

15. The semiconductor device of claim 1, wherein the high band gap layer includes a material having a higher energy band gap than the first anti-ferroelectric layer, the second anti-ferroelectric layer, and the ferroelectric layer.

16. The semiconductor device of claim 1, wherein the high band gap layer includes aluminum oxide or beryllium oxide.

17. The semiconductor device of claim 1, wherein the interface layer includes a stack of molybdenum and molybdenum nitride (Mo/MoN) or a stack of tungsten and tungsten nitride (W/WN).

18. The semiconductor device of claim 1, further comprising:
a semiconductor substrate including a first doped region and a second doped region;
a word line buried in a semiconductor substrate between the first doped region and the second doped region;
a bit line formed over the word line and coupled to the first doped region; and
a storage node contact plug coupled to the second doped region,
wherein the first electrode is electrically connected to the storage node contact plug.

* * * * *